(12) United States Patent
Masuda et al.

(10) Patent No.: US 12,513,950 B2
(45) Date of Patent: Dec. 30, 2025

(54) SILICON CARBIDE SEMICONDUCTOR DEVICE

(71) Applicant: SUMITOMO ELECTRIC INDUSTRIES, LTD., Osaka (JP)

(72) Inventors: Takeyoshi Masuda, Osaka (JP); Ryouji Kosugi, Tsukuba (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 458 days.

(21) Appl. No.: 18/014,166

(22) PCT Filed: May 26, 2021

(86) PCT No.: PCT/JP2021/019996
§ 371 (c)(1),
(2) Date: Jan. 2, 2023

(87) PCT Pub. No.: WO2022/009549
PCT Pub. Date: Jan. 13, 2022

(65) Prior Publication Data
US 2023/0261042 A1    Aug. 17, 2023

(30) Foreign Application Priority Data
Jul. 10, 2020    (JP) .................. 2020-118899

(51) Int. Cl.
*H10D 62/10*    (2025.01)
*H10D 8/00*    (2025.01)
(Continued)

(52) U.S. Cl.
CPC .......... *H10D 62/111* (2025.01); *H10D 8/422* (2025.01); *H10D 8/60* (2025.01); *H10D 30/664* (2025.01);
(Continued)

(58) Field of Classification Search
None
See application file for complete search history.

(56) References Cited

U.S. PATENT DOCUMENTS

2006/0131644 A1* 6/2006 Saito ............... H10D 30/66
257/329
2008/0017897 A1* 1/2008 Saito ............... H10D 30/0297
257/E29.136
(Continued)

FOREIGN PATENT DOCUMENTS

JP    2007-300034 A    11/2007
JP    2012-195541 A    10/2012
(Continued)

*Primary Examiner* — Xiaoming Liu
(74) *Attorney, Agent, or Firm* — Renner, Otto, Boisselle & Sklar, LLP

(57) ABSTRACT

A super junction layer alternately has a first region and a second region. An element layer is provided above the super junction layer. The first region has a first portion and a second portion located between the first portion and a first main surface. The second region has a third portion in contact with the first portion and a fourth portion in contact with the second portion and located between the third portion and the first main surface. In a cross section perpendicular to the second main surface and parallel to a direction from the first region toward the second region, a width of the second portion is larger than a width of the first portion, a width of the fourth portion is smaller than a width of the third portion.

11 Claims, 6 Drawing Sheets

(51) Int. Cl.
*H10D 8/60* (2025.01)
*H10D 30/66* (2025.01)
*H10D 62/832* (2025.01)

(52) U.S. Cl.
CPC ....... *H10D 30/668* (2025.01); *H10D 62/8325* (2025.01)

(56) References Cited

U.S. PATENT DOCUMENTS

| | | | |
|---|---|---|---|
| 2014/0231903 A1* | 8/2014 | Willmeroth | H10D 62/111 |
| | | | 257/330 |
| 2016/0204206 A1* | 7/2016 | Masuda | H01L 21/049 |
| | | | 257/77 |
| 2019/0074360 A1 | 3/2019 | Hiyoshi et al. | |
| 2019/0288061 A1* | 9/2019 | Weber | H01L 21/26586 |
| 2019/0333988 A1 | 10/2019 | Furuhashi et al. | |
| 2021/0111245 A1 | 4/2021 | Kosugi et al. | |

FOREIGN PATENT DOCUMENTS

| | | | |
|---|---|---|---|
| JP | 2013165197 A | 8/2013 | |
| JP | 2015-216182 A | 12/2015 | |
| JP | 2016-015377 A | 1/2016 | |
| JP | 2019-057629 A | 4/2019 | |
| JP | 2019-520703 A | 7/2019 | |
| WO | 2017/179377 A1 | 10/2017 | |
| WO | 2017/209825 A1 | 12/2017 | |
| WO | 2018029951 A1 | 2/2018 | |
| WO | 2019/160086 A1 | 8/2019 | |

* cited by examiner

SILICON CARBIDE SEMICONDUCTOR DEVICE

TECHNICAL FIELD

The present disclosure relates to a silicon carbide semiconductor device. The present application claims a priority based on Japanese Patent Application No. 2020-118899 filed on Jul. 10, 2020, the entire contents of which are incorporated herein by reference.

BACKGROUND ART

WO 2017/179377 (PTL 1) describes a MOSFET (Metal Oxide Semiconductor Field Effect Transistor) having a super junction structure. Each of Japanese National Patent Publication No. 2019-520703 (PTL 2) and Japanese Patent Laying-Open No. 2015-216182 (PTL 3) describes a super junction structure of a silicon carbide semiconductor formed by ion implantation employing a channeling phenomenon.

CITATION LIST

Patent Literature

PTL 1: WO 2017/179377
PTL 2: Japanese National Patent Publication No. 2019-520703
PTL 3: Japanese Patent Laying-Open No. 2015-216182

SUMMARY OF INVENTION

A silicon carbide semiconductor device according to the present disclosure includes a substrate, a super junction layer, an element layer, a first electrode, and a second electrode. The substrate is composed of a silicon carbide semiconductor having a first conductivity type. The super junction layer is provided above a first main surface of the substrate and alternately has a first region having the first conductivity type and a second region having a second conductivity type. The element layer is provided above the super junction layer. A first electrode is provided on the element layer. The second electrode is provided on a second main surface of the substrate opposite to the first main surface. The first region has a first portion and a second portion located between the first portion and the first main surface. The second region has a third portion in contact with the first portion and a fourth portion in contact with the second portion and located between the third portion and the first main surface. In a cross section perpendicular to the second main surface and parallel to a direction from the first region toward the second region, a width of the second portion is larger than a width of the first portion, a width of the fourth portion is smaller than a width of the third portion, a total value of the width of the first portion and the width of the third portion is 0.5 µm or more and 4 µm or less, and a height of each of the first region and the second region is 2 µm or more.

DETAILED DESCRIPTION

Figure 1:
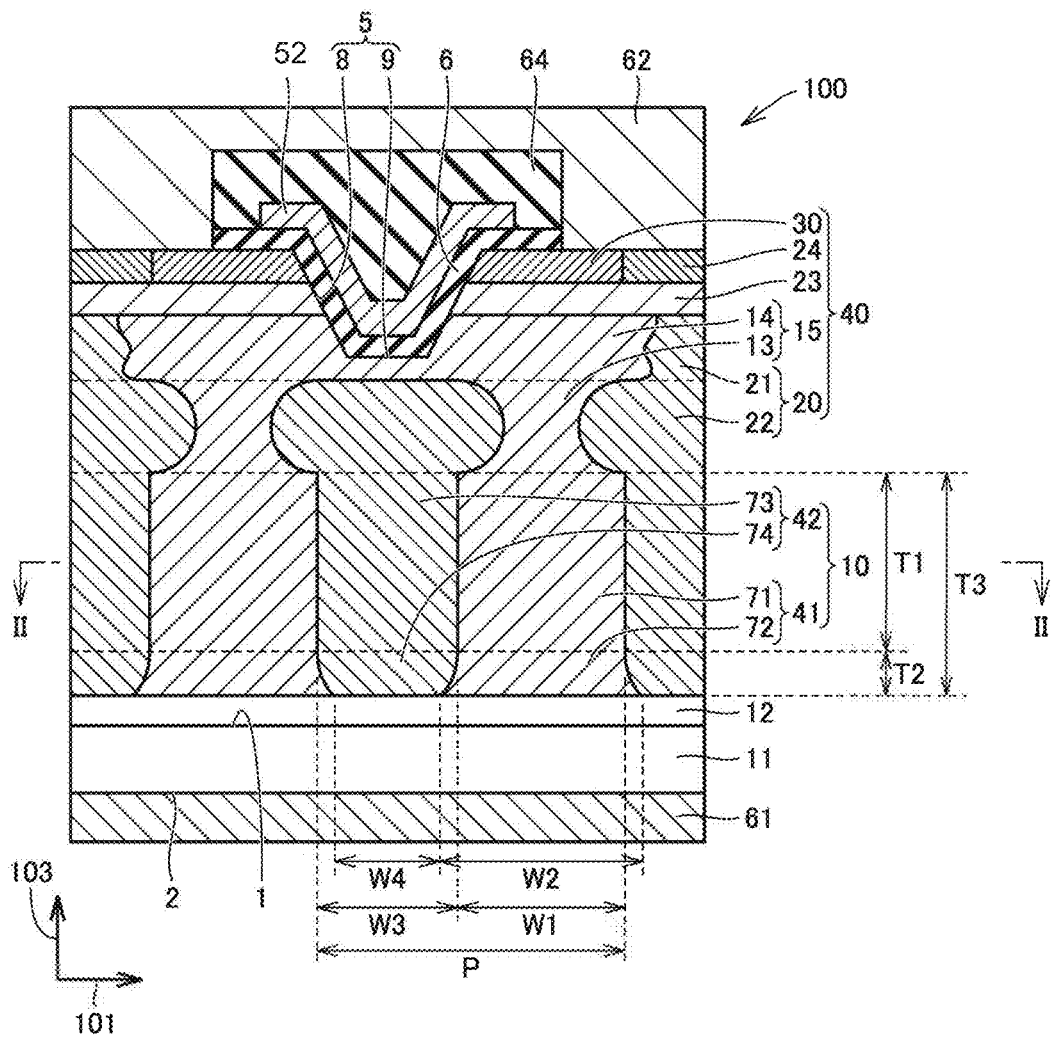
FIG. 1 is a schematic longitudinal cross sectional view showing a configuration of a silicon carbide semiconductor device according to a first embodiment.

Problem to be Solved by the Present Disclosure

It is an object of the present disclosure to provide a silicon carbide semiconductor device to improve breakdown voltage while reducing on-resistance.

Advantageous Effect of the Present Disclosure

According to the present disclosure, there can be provided a silicon carbide semiconductor device to improve breakdown voltage while reducing on-resistance.

DESCRIPTION OF EMBODIMENTS

First, embodiments of the present disclosure are listed and described. Regarding crystallographic indications in the present specification, an individual orientation is represented by [ ], a group orientation is represented by < >, and an individual plane is represented by ( ) and a group plane is represented by { }. A crystallographically negative index is normally expressed by putting "-" (bar) above a numeral; however, in the present specification, the crystallographically negative index is expressed by putting a negative sign before the numeral.

(1) A silicon carbide semiconductor device 100 according to the present disclosure includes a substrate 11, a super junction layer 10, an element layer 40, a first electrode 62, and a second electrode 61. Substrate 11 is composed of a silicon carbide semiconductor having a first conductivity type. Super junction layer 10 is provided above first main surface 1 of substrate 11, and alternately has a first region 41 having the first conductivity type and a second region 42 having a second conductivity type. Element layer 40 is provided above super junction layer 10. First electrode 62 is provided on element layer 40. Second electrode 6162 is provided on a second main surface 2 of substrate 11 opposite to first main surface 1. First region 41 has a first portion 71 and a second portion 72 located between first portion 71 and first main surface 1. Second region 42 has a third portion 73 in contact with first portion 71 and a fourth portion 74 in contact with second portion 72 and located between third portion 73 and first main surface 1. In a cross section perpendicular to second main surface 2 and parallel to a direction from first region 41 toward second region 42, a width of second portion 72 is larger than a width of first portion 71, a width of fourth portion 74 is smaller than a width of third portion 73, a total value of the width of first portion 71 and the width of third portion 73 is 0.5 µm or more and 4 µm or less, and a height of each of first region 41 and second region 42 is 2 µm or more.

(2) In silicon carbide semiconductor device 100 according to (1), in the cross section perpendicular to second main surface 2 and parallel to the direction from first region 41 toward second region 42, the width of first portion 71 may be smaller than a height of first portion 71, and the width of third portion 73 may be smaller than a height of third portion 73.

(3) In silicon carbide semiconductor device 100 according to (1) or (2), an impurity concentration in third portion 73 may be higher than an impurity concentration in fourth portion 74.

(4) In silicon carbide semiconductor device 100 according to any one of (1) to (3), an impurity concentration of each of first portion 71 and third portion 73 may be $3 \times 10^{16}$ cm$^{-3}$ or more and $5 \times 10^{17}$ cm$^{-3}$ or less.

(5) In silicon carbide semiconductor device 100 according to any one of (1) to (4), a buffer layer 12 having the first conductivity type may be provided between super junction layer 10 and substrate 11.

(6) In silicon carbide semiconductor device 100 according to any one of (1) to (5), element layer 40 may include a first impurity region 15 having the first conductivity type, a second impurity region 23 in contact with first impurity region 15 and having the second conductivity type, and a third impurity region 30 separated from first impurity region 15 by second impurity region 23 and having the first conductivity type. Element layer 40 may be provided with a trench 5 that has a side surface 8 constituted of each of first impurity region 15, second impurity region 23, and third impurity region 30, and that has a bottom portion 9 contiguous to side surface 8 and constituted of first impurity region 15. First electrode 62 may be a source electrode, and second electrode 61 may be a drain electrode. A gate electrode may be provided inside trench 5.

(7) In silicon carbide semiconductor device 100 according to any one of (1) to (6), first main surface 1 may correspond to a {0001} plane or a plane inclined at an angle of 8° or less with respect to the {0001} plane.

Details of Embodiments of the Present Disclosure

Hereinafter, embodiments of the present disclosure will be described in detail. In the description below, the same or corresponding elements are denoted by the same reference characters, and will not be described repeatedly.

First Embodiment

First, a configuration of a silicon carbide semiconductor device 100 according to a first embodiment will be described. FIG. 1 is a schematic longitudinal cross sectional view showing the configuration of silicon carbide semiconductor device 100 according to the first embodiment.

As shown in FIG. 1, silicon carbide semiconductor device 100 according to the first embodiment is, for example, a trench type MOSFET. Silicon carbide semiconductor device 100 according to the first embodiment mainly has, for example, a substrate 11, a super junction layer 10, an element layer 40, a first electrode 62, a second electrode 61, a gate electrode 52, a gate insulating film 6, a separation insulating film 64, and a buffer layer 12. Substrate 11 is composed of a silicon carbide semiconductor having a first conductivity type. The first conductivity type is, for example, n type conductivity. Substrate 11 includes an n type impurity that can provide the n type conductivity, such as N (nitrogen). Substrate 11 has a first main surface 1 and a second main surface 2. Second main surface 2 is opposite to first main surface 1. Second main surface 2 is a surface on a side opposite to first main surface 1.

Substrate 11 is composed of, for example, hexagonal silicon carbide having polytype 4H. First main surface 1 may correspond to, for example, a {0001} plane or a plane inclined at an angle of 8° or less with respect to the {0001} plane. Specifically, first main surface 1 may correspond to a (0001) plane or a plane inclined at an angle of 8° or less with respect to the (0001) plane. First main surface 1 may correspond to a (000-1) plane or a plane inclined at an angle of 8° or less with respect to the (000-1) plane.

Buffer layer 12 is located between super junction layer 10 and substrate 11. Buffer layer 12 has, for example, the n type conductivity (first conductivity type). Buffer layer 12 includes an n type impurity that can provide the n type conductivity, such as N (nitrogen).

Super junction layer 10 is provided above first main surface 1 of substrate 11. Super junction layer 10 is in contact with buffer layer 12. Super junction layer 10 alternately has first regions 41 and second regions 42. For example, first regions 41 and second regions 42 are alternately arranged along a direction (first direction 101) parallel to first main surface 1. From another viewpoint, for example, it can be said that first regions 41 and second regions 42 are alternately arranged along a direction intersecting a thickness direction of substrate 11.

First region 41 has the n type conductivity (first conductivity type). First region 41 includes an n type impurity that can provide the n type conductivity, such as N (nitrogen). Second region 42 has a p type conductivity (second conductivity type). Second region 42 includes a p type impurity that can provide the p type conductivity, such as Al (aluminum).

Figure 2:
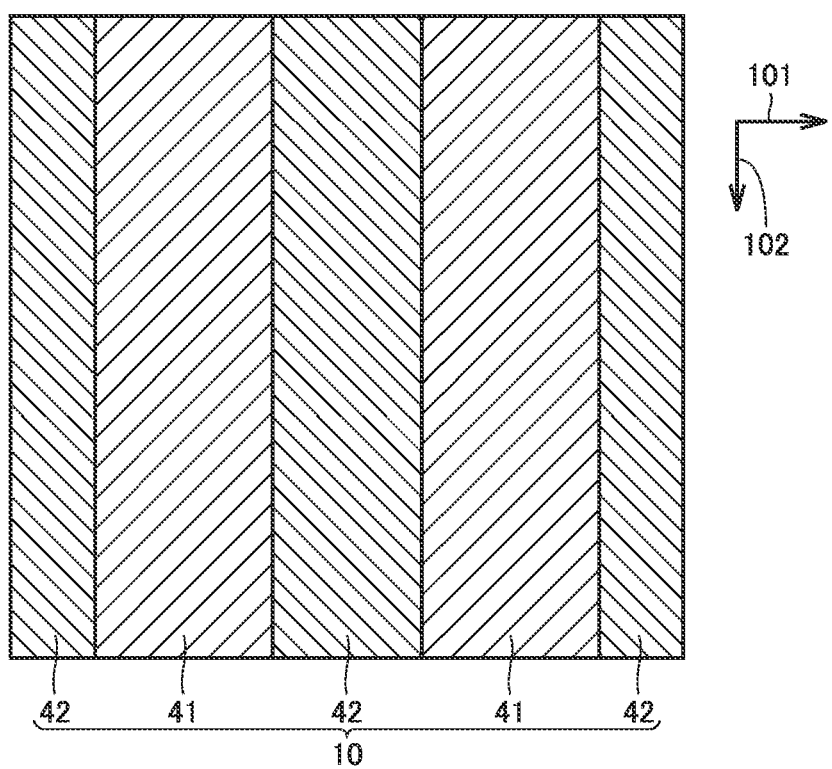
FIG. 2 is a schematic transverse cross sectional view taken along a line II-II of FIG. 1.

FIG. 2 is a schematic transverse cross sectional view taken along a line II-II of FIG. 1. As shown in FIG. 2, when viewed in a plan view, the long side direction of each of first region 41 and second region 42 is a second direction 102. When viewed in a plan view, the short side direction of each of first region 41 and second region 42 is a first direction 101. When viewed in a plan view, each of first region 41 and second region 42 may have a substantially rectangular shape.

Each of first direction 101 and second direction 102 is parallel to first main surface 1. First direction 101 is a direction perpendicular to second direction 102. First direction 101 is, for example, a <11-20> direction. Second direction 102 is, for example, a <1-100> direction. First direction 101 may be, for example, a direction obtained by projecting the <11-20> direction onto first main surface 1. Second direction 102 may be, for example, a direction obtained by projecting the <1-100> direction onto first main surface 1.

As shown in FIG. 1, a third direction 103 is a direction perpendicular to each of first direction 101 and second direction 102. Third direction 103 is, for example, a <0001> direction. Third direction 103 may be a direction inclined with respect to the <0001> direction, for example.

First region 41 has a first portion 71 and a second portion 72. Second portion 72 is located between first portion 71 and first main surface 1. First portion 71 and second portion 72 are adjacent to each other in third direction 103. Second portion 72 may be in contact with buffer layer 12 or may be in contact with first main surface 1.

Second region 42 has a third portion 73 and a fourth portion 74. Fourth portion 74 is located between third portion 73 and first main surface 1. Third portion 73 and fourth portion 74 are adjacent to each other in third direction 103. Fourth portion 74 may be in contact with buffer layer 12 or may be in contact with first main surface 1.

Third portion 73 is in contact with first portion 71. Third portion 73 and first portion 71 are adjacent to each other in first direction 101. Third portions 73 and first portions 71 are alternately arranged in first direction 101. Fourth portion 74 is in contact with second portion 72. Fourth portion 74 and second portion 72 are adjacent to each other in first direction 101. Fourth portions 74 and second portions 72 are alternately arranged in first direction 101.

As shown in FIG. 1, in a cross section perpendicular to second main surface 2 and parallel to a direction from first region 41 toward second region 42, a width of second portion 72 is larger than a width (first width W1) of first portion 71. A width of second portion 72 may be monotonously increased in a direction from first portion 71 toward first main surface 1. A width (second width W2) of second portion 72 in contact with buffer layer 12 is larger than first width W1.

As shown in FIG. 1, in the cross section perpendicular to second main surface 2 and parallel to the direction from first region 41 toward second region 42, a width of fourth portion 74 is smaller than a width of third portion 73 (third width W3). The width of fourth portion 74 may be monotonously decreased in a direction from third portion 73 toward first main surface 1. A width (fourth width W4) of fourth portion 74 in contact with buffer layer 12 is smaller than third width W3.

As shown in FIG. 1, a total value of the width (first width W1) of first portion 71 and the width (third width W3) of third portion 73 is 0.5 µm or more and 4 µm or less. The total value of the width (first width W1) of first portion 71 and the width (third width W3) of third portion 73 is a pitch P of the super junction layer. The lower limit of the total value of the width (first width W1) of first portion 71 and the width (third width W3) of third portion 73 is not particularly limited, but may be, for example, 1 µm or more or 2 µm or more. The upper limit of the total value of the width (first width W1) of first portion 71 and the width (third width W3) of third portion 73 is not particularly limited, but may be, for example, 4 µm or less, or 3 µm or less.

As shown in FIG. 1, in the cross section perpendicular to second main surface 2 and parallel to the direction from first region 41 toward second region 42, the width (first width W1) of first portion 71 may be smaller than a height (first height T1) of first portion 71. The height (first height T1) of first portion 71 may be larger than a height (second height T2) of second portion 72.

As shown in FIG. 1, in the cross section perpendicular to second main surface 2 and parallel to the direction from first region 41 toward second region 42, the width (third width W3) of third portion 73 may be smaller than the height (first height T1) of third portion 73. The height (first height T1) of third portion 73 may be larger than a height (second height T2) of fourth portion 74.

A total of the height (first height T1) of first portion 71 and the height (second height T2) of second portion 72 is a height (third height T3) of first region 41. Similarly, a total of the height (first height T1) of third portion 73 and the height (second height T2) of fourth portion 74 is a height (third height T3) of second region 42.

The height (third height T3) of each of first region 41 and second region 42 is 2 µm or more. The lower limit of the height of each of first region 41 and second region 42 is not particularly limited, but may be, for example, 2.5 µm or more, or 3 µm or more. The upper limit of the height of each of first region 41 and second region 42 is not particularly limited, but may be, for example, 5 µm or less or 4 µm or less.

An impurity concentration in third portion 73 may be higher than an impurity concentration in fourth portion 74. An impurity concentration in first portion 71 is substantially the same as an impurity concentration in second portion 72. The impurity concentration in first portion 71 is substantially the same as the impurity concentration in third portion 73. The impurity concentration in fourth portion 74 may be lower than the impurity concentration in second portion 72.

The impurity concentration of each of first portion 71 and third portion 73 may be, for example, $3 \times 10^{16}$ cm$^{-3}$ or more and $5 \times 10^{17}$ cm$^{-3}$ or less. The lower limit of the impurity concentration of each of first portion 71 and third portion 73 is not particularly limited, but may be, for example, $4 \times 10^{16}$ cm$^{-3}$ or more, or $5 \times 10^{16}$ cm$^{-3}$ or more. The upper limit of the impurity concentration of each of first portion 71 and third portion 73 is not particularly limited, but may be, for example, $3 \times 10^{17}$ cm$^{-3}$ or less, or $2 \times 10^{17}$ cm$^{-3}$ or less.

Element layer 40 is provided above super junction layer 10. Element layer 40 is, for example, a switching element. Element layer 40 has, for example, a first impurity region 15, a second impurity region 23, a third impurity region 30, a fourth impurity region 24, and a fifth impurity region 20. First impurity region 15 is, for example, a drift region.

First impurity region 15 has the n type conductivity (first conductivity type). First impurity region 15 includes an n type impurity that can provide the n type conductivity, such as N (nitrogen). First impurity region 15 is in contact with first region 41. First impurity region 15 has a first drift layer 14 and a second drift layer 13. First drift layer 14 is in contact with gate insulating film 6. Second drift layer 13 is contiguous to first drift layer 14. Second drift layer 13 is located between first drift layer 14 and first region 41. The width of second drift layer 13 at its center is smaller than each of the widths of the upper and lower portions of second drift layer 13.

Second impurity region 23 is, for example, a body region. Second impurity region 23 is in contact with first impurity region 15. Second impurity region 23 has the p type conductivity (second conductivity type). Second impurity region 23 includes a p type impurity that can provide the p type conductivity, such as Al (aluminum). Second impurity region 23 is electrically connected to second region 42. The concentration of the p type impurity in second impurity region 23 may be higher than the concentration of the n type impurity in first impurity region 15.

Third impurity region 30 is, for example, a source region. Third impurity region 30 is separated from first impurity region 15 by second impurity region 23. Third impurity region 30 has the n type conductivity (first conductivity type). Third impurity region 30 includes an n type impurity that can provide the n type conductivity, such as P (phosphorus). The concentration of the n type impurity in third impurity region 30 may be higher than the concentration of the p type impurity in second impurity region 23.

Fourth impurity region 24 is, for example, a contact region. Fourth impurity region 24 is in contact with second impurity region 23 and third impurity region 30. Fourth impurity region 24 has the p type conductivity (second conductivity type). Fourth impurity region 24 includes a p type impurity that can provide the p type conductivity, such as Al (aluminum). The concentration of the p type impurity in fourth impurity region 24 may be higher than the concentration of the p type impurity in second impurity region 23.

Fifth impurity region 20 connects second impurity region 23 and second region 42 to each other. Fifth impurity region 20 is in contact with each of first impurity region 15, second impurity region 23, and second region 42. Fifth impurity region 20 has the p type conductivity (second conductivity type). Fifth impurity region 20 includes a p type impurity that can provide the p type conductivity, such as Al (aluminum).

Fifth impurity region 20 has a first connection region 21 and a second connection region 22. First connection region 21 is in contact with each of second impurity region 23 and first drift layer 14. Second connection region 22 is in contact with each of first connection region 21 and second region 42. Second connection region 22 is located between first connection region 21 and second region 42 in third direction 103.

Gate insulating film 6 is provided on element layer 40. Gate insulating film 6 is composed of silicon dioxide, for example. Gate insulating film 6 is in contact with, for example, each of first impurity region 15, second impurity region 23, and third impurity region 30. A channel can be formed in second impurity region 23 that is in contact with gate insulating film 6.

Gate electrode 52 is provided on gate insulating film 6. Gate electrode 52 is in contact with gate insulating film 6. Gate electrode 52 is composed of a conductor such as polysilicon doped with an impurity, for example.

Trench 5 is provided in element layer 40. Trench 5 is defined by a side surface 8 and a bottom portion 9. Side surface 8 is constituted of each of first impurity region 15, second impurity region 23, and third impurity region 30. Bottom portion 9 is contiguous to side surface 8. Bottom portion 9 is constituted of first impurity region 15.

At least a portion of gate insulating film 6 is provided inside trench 5, for example. Gate insulating film 6 is in contact with each of first impurity region 15, second impurity region 23, and third impurity region 30 at side surface 8. Gate insulating film 6 is in contact with the first impurity region at bottom portion 9. At least a portion of the gate electrode is provided inside trench 5, for example.

First electrode 62 is, for example, a source electrode. First electrode 62 is provided on element layer 40. First electrode 62 is in contact with third impurity region 30 and fourth impurity region 24. First electrode 62 may cover a separation insulating film 64. Second electrode 61 is, for example, a drain electrode. Second electrode 61 is provided on second main surface 2 of substrate 11.

Separation insulating film 64 is provided to cover gate electrode 52. Separation insulating film 64 is in contact with each of gate electrode 52 and gate insulating film 6. Separation insulating film 64 is constituted of, for example, a NSG (None-doped Silicate Glass) film, a PSG (Phosphorus Silicate Glass) film, or the like. Separation insulating film 64 electrically insulates gate electrode 52 and first electrode 62 from each other.

Next, a method of forming super junction layer 10 will be described.

First, buffer layer 12 is formed on substrate 11. Buffer layer 12 is formed by epitaxial growth, for example. Next, first region 41 is formed on buffer layer 12. First region 41 is formed by, for example, epitaxial growth. Each of buffer layer 12 and first region 41 has the n type conductivity (first conductivity type). Next, a mask layer (not shown) is formed on first region 41.

Next, a channeling ion implantation step is performed. Specifically, in the state in which the mask layer is disposed on first region 41, impurity ions that can provide the p type conductivity (second conductivity type) such as aluminum are implanted into first region 41. An implantation energy is, for example, 960 keV. An implantation temperature is, for example, a room temperature. Thus, second regions 42 are formed in portions of first region 41. Second regions 42 are provided to be separated from each other in first direction 101. Thus, super junction layer 10 in which first regions 41 and second regions 42 are alternately arranged is formed (see FIG. 2).

In the channeling ion implantation step, the impurity ions are implanted in a direction substantially parallel to the <0001> direction, which corresponds to a crystal axis of silicon carbide. The impurity ion implantation direction may be inclined by an angle of 0.5° or less with respect to the <0001> direction, for example. Specifically, the impurity ion implantation direction may be a direction obtained by inclining third direction 103 in an off direction. The off direction may be, for example, first direction 101 or second direction 102. Thus, scattering of the impurity ions and the silicon carbide can be reduced, with the result that the impurity ions can be implanted deeply. As a result, second region 42 having a thickness of 2 μm or more is formed (see FIG. 1). Second region 42 has third portion 73 and fourth portion 74. Fourth portion 74 is formed to have a width smaller than the width of third portion 73.

Figure 3:
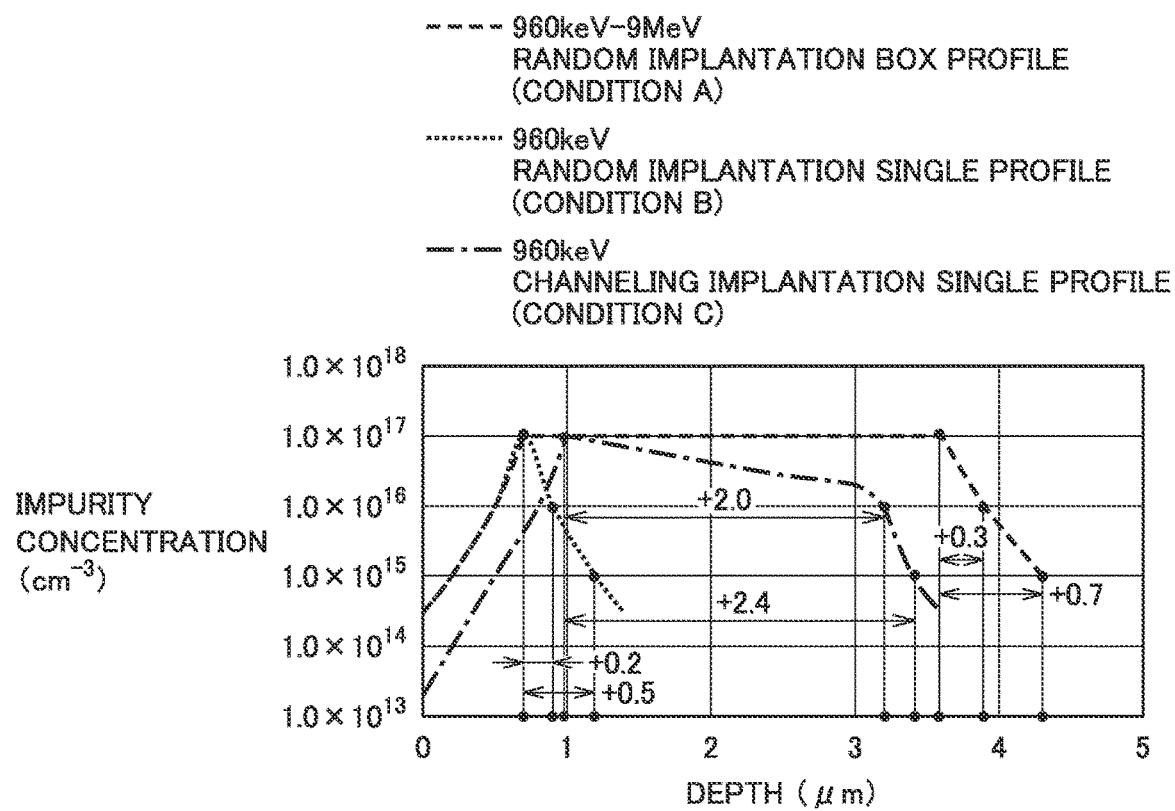
FIG. 3 is a schematic diagram showing an impurity concentration profile.

FIG. 3 is a schematic diagram showing an impurity concentration profile. A condition A is a box profile when random implantation is performed. In condition A, the implantation energy is changed in a range of 960 keV to 9 MeV. A condition B is a single profile when random implantation is performed. In condition B, the implantation energy is 960 keV. A condition C is a single profile when channeling implantation is performed. In condition C, the implantation energy is 960 keV.

As shown in conditions B and C in FIG. 3, in the case of the channeling implantation, implantation can be performed more deeply than that in the random implantation. In the case of condition C, the implantation depth is 2 μm or more. On the other hand, when multi-stage implantation is performed using the random implantation, an impurity region having an implantation depth as deep as that in condition C can be formed. However, in order to form, by using the random implantation, the impurity region having an implantation depth as deep as that in condition C, the implantation energy needs to be as high as about 9 MeV.

Second Embodiment

Next, a configuration of a silicon carbide semiconductor device 100 according to a second embodiment will be described. The configuration of silicon carbide semiconductor device 100 according to the second embodiment is different from the configuration of silicon carbide semiconductor device 100 according to the first embodiment mainly in that first regions 41 are stacked together and second regions 42 are stacked together in super junction layer 10, and is the same as the configuration of silicon carbide semiconductor device 100 according to the first embodiment in terms of the other points. The following mainly describes the configuration different from the configuration of silicon carbide semiconductor device 100 according to the first embodiment.

Figure 4:
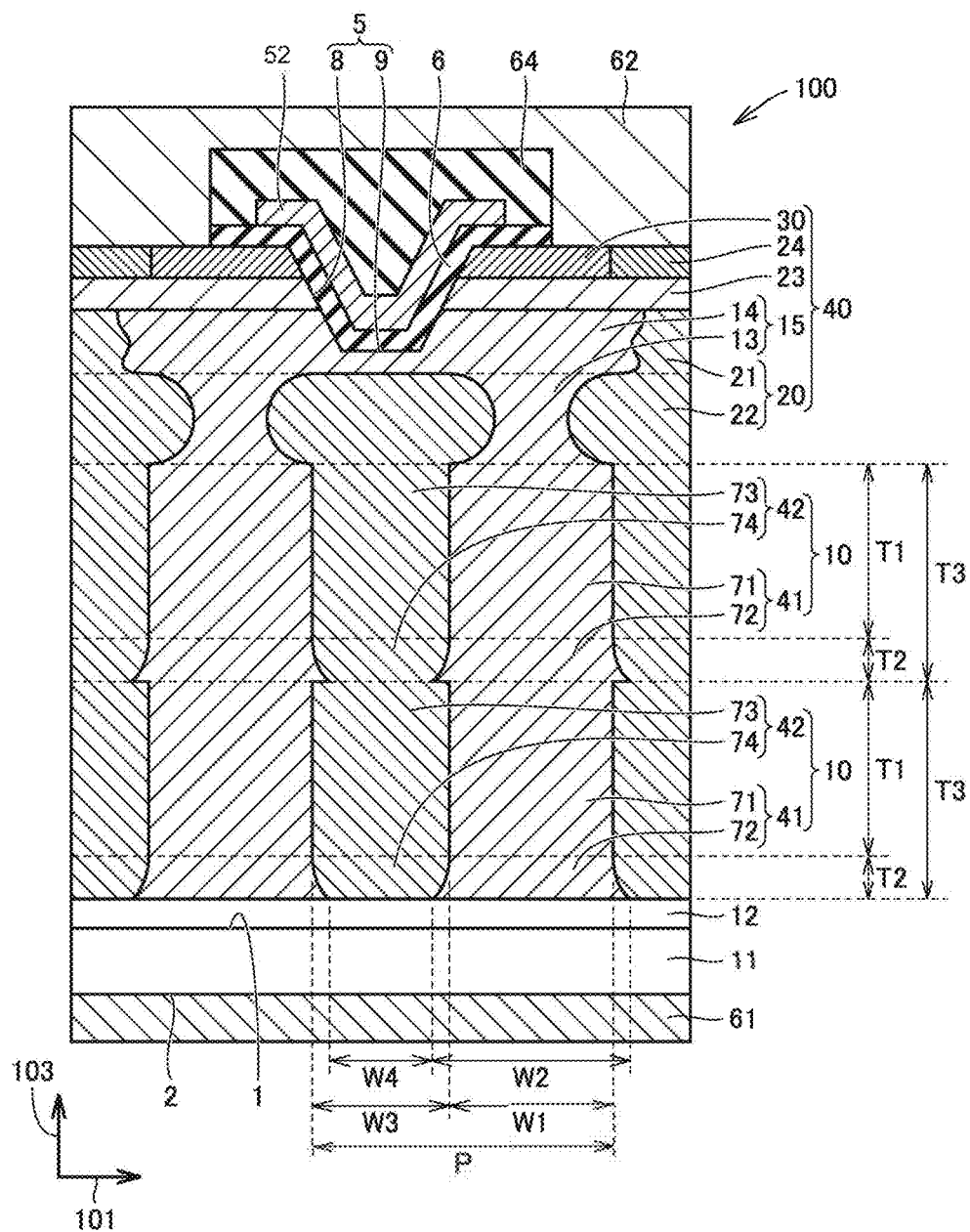
FIG. 4 is a partial schematic longitudinal cross sectional view showing a configuration of a silicon carbide semiconductor device according to a second embodiment.

FIG. 4 is a partial schematic longitudinal cross sectional view showing the configuration of silicon carbide semiconductor device 100 according to the second embodiment. As shown in FIG. 4, in super junction layer 10, first regions 41 are stacked together and second regions 42 are stacked together. The plurality of first regions 41 are provided along third direction 103. First portions 71 and second portions 72 are alternately arranged along third direction 103. Similarly, the plurality of second regions 42 are provided along third direction 103. Third portions 73 and fourth portions 74 are alternately arranged along third direction 103.

Each of the lower limit of the number of stacked first regions 41 and the lower limit of the number of stacked second regions 42 is not particularly limited, but may be, for example, 2 or more or 3 or more. Each of the upper limit of the number of stacked first regions 41 and the upper limit of the number of stacked second regions 42 is not particularly limited, but may be, for example, 10 or less or 6 or less.

Stacked first regions 41 and stacked second regions 42 can be formed by alternately repeating the epitaxial growth step and the channeling ion implantation step. For example, a first region 41 in a lower layer is formed in a first epitaxial growth step. A first region 41 in an upper layer is formed in a second epitaxial growth step. Strictly speaking, a growth condition in the first epitaxial growth step is different from a growth condition in the second epitaxial growth step. Therefore, the impurity concentration of first region 41 in the lower layer may be different from the impurity concentration of first region 41 in the upper layer. From another viewpoint, it can be said that when the impurity concentration profile of first region 41 in the upper layer and the impurity concentration profile of first region 41 in the lower layer are measured by SIMS (Secondary Ion Mass Spectrometry) along third direction 103, an impurity concentration profile of first region 41 in the upper layer may be discontinuous from an impurity concentration profile of first region 41 in the lower layer.

The height of each of first region 41 and second region 42 in one layer is, for example, 2 μm or more and 4 μm or less. By stacking first regions 41 together and stacking second regions 42 together, each of the total thickness of first regions 41 and the total thickness of second regions 42 can be large. The lower limit of each of the total thickness of first regions 41 and the total thickness of second regions 42 is not particularly limited, but may be, for example, 4 μm or more or 6 μm or more. The upper limit of each of the total thickness of first regions 41 and the total thickness of second regions 42 is not particularly limited, but may be, for example, 30 μm or less or 20 μm or less.

Third Embodiment

Next, a configuration of a silicon carbide semiconductor device 100 according to a third embodiment will be described. The configuration of silicon carbide semiconductor device 100 according to the third embodiment is mainly different from the configuration of silicon carbide semiconductor device 100 according to each of the first and second embodiments in that silicon carbide semiconductor device 100 is a planar type MOSFET, and is the same as the configuration of silicon carbide semiconductor device 100 according to each of the first and second embodiments in terms of the other points. The following mainly describes the configuration different from the configuration of silicon carbide semiconductor device 100 according to each of the first and second embodiments.

Figure 5:
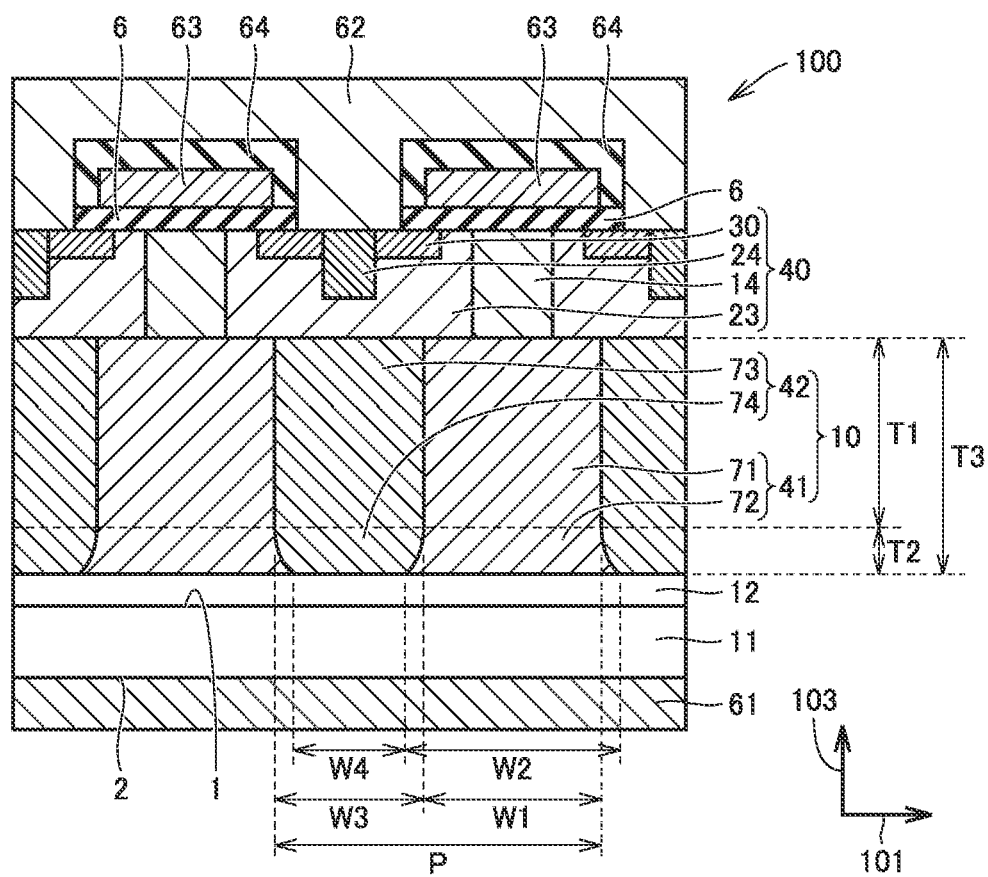
FIG. 5 is a schematic longitudinal cross sectional view showing a configuration of a silicon carbide semiconductor device according to a third embodiment.

FIG. 5 is a schematic longitudinal cross sectional view showing the configuration of silicon carbide semiconductor device 100 according to the third embodiment. As shown in FIG. 5, no trench 5 is provided in element layer 40. An upper end surface of element layer 40 is, for example, a flat surface. Gate insulating film 6 extends, for example, along a direction parallel to first main surface 1. Gate insulating film 6 is in contact with each of first impurity region 15, second impurity region 23, and third impurity region 30 at the upper end surface of element layer 40.

As shown in FIG. 5, first region 41 of super junction layer 10 faces each of gate insulating film 6 and third electrode 63. Second region 42 of super junction layer 10 faces each of third impurity region 30 and fourth impurity region 24. Second region 42 may be in contact with third impurity region 30 and may be separated from first impurity region 15.

Fourth Embodiment

Next, a configuration of a silicon carbide semiconductor device 100 according to a fourth embodiment will be described. The configuration of silicon carbide semiconductor device 100 according to the fourth embodiment is mainly different from the configuration of silicon carbide semiconductor device 100 according to each of the first and second embodiments in that silicon carbide semiconductor device 100 is a PN diode, and is the same as the configuration of silicon carbide semiconductor device 100 according to each of the first and second embodiments in terms of the other points. The following mainly describes the configuration different from the configuration of silicon carbide semiconductor device 100 according to each of the first and second embodiments.

Figure 6:
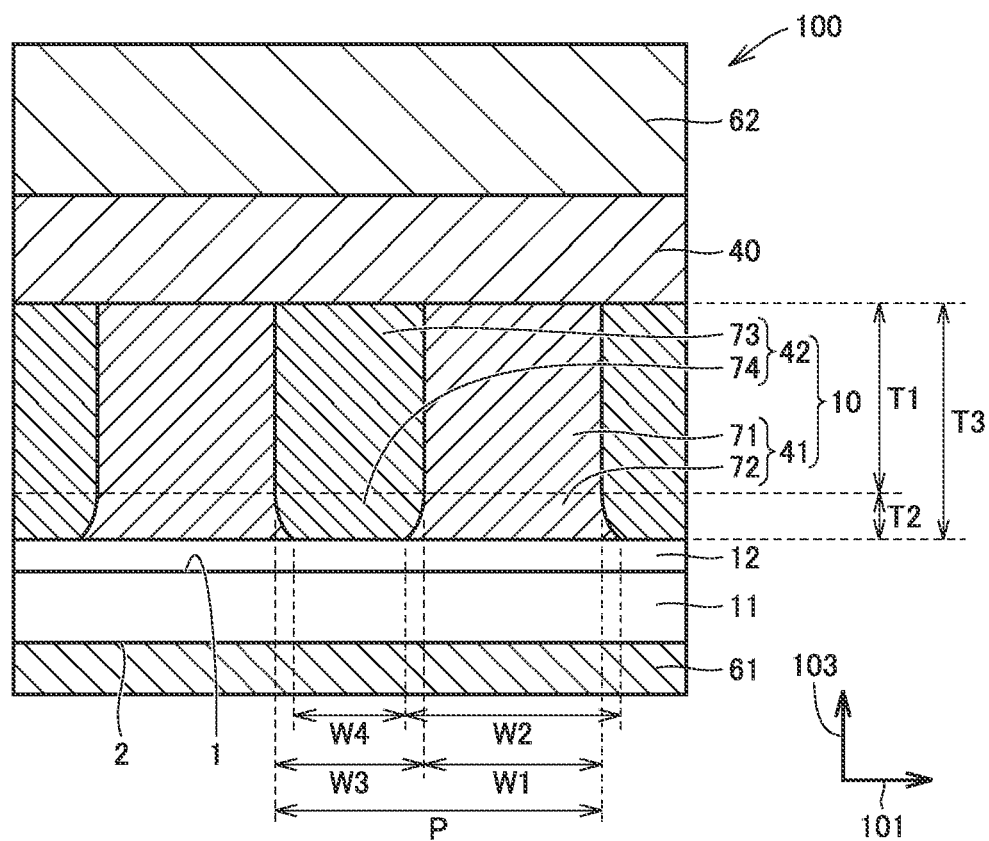
FIG. 6 is a schematic longitudinal cross sectional view showing a configuration of a silicon carbide semiconductor device according to a fourth embodiment.

FIG. 6 is a schematic longitudinal cross sectional view showing the configuration of silicon carbide semiconductor device 100 according to the fourth embodiment. As shown in FIG. 6, element layer 40 has, for example, the p type conductivity (second conductivity type). First electrode 62 is in contact with element layer 40. First electrode 62 is provided on element layer 40. Element layer 40 is provided on super junction layer 10. For example, element layer 40 is in contact with each of first region 41 and second region 42. Second electrode 61 is, for example, a cathode electrode. First electrode 62 is, for example, an anode electrode.

It should be noted that although the fourth embodiment shows the example of the PN diode, it can be modified to a Schottky diode. That is, in FIG. 6, element layer 40 may be a Schottky electrode instead of the silicon carbide semiconductor layer.

Next, the following describes a method of measuring the concentration of the p type impurity and the concentration of the n type impurity in the respective impurity regions.

Each of the concentration of the p type impurity and the concentration of the n type impurity in the respective impurity regions can be measured using SIMS. A measuring device is, for example, a secondary ion mass spectrometer provided by Cameca. A measurement pitch is, for example, 0.01 μm. When the n type impurity to be detected is nitrogen, a primary ion beam is cesium (Cs). A primary ion energy is 14.5 keV. A secondary ion polarity is negative. When the p type impurity to be detected is aluminum or boron, the primary ion beam is oxygen ($O_2$). The primary ion energy is 8 keV. The secondary ion polarity is positive.

Next, the following describes a method of distinguishing the p type region and the n type region from each other.

In the method of distinguishing the p type region and the n type region from each other, SCM (Scanning Capacitance Microscope) is used. A measuring device is, for example, NanoScope IV provided by Bruker AXS. The SCM is a method of visualizing a carrier concentration distribution in a semiconductor. Specifically, a metal-coated silicon probe is used to scan a surface of a sample. On this occasion, a high-frequency voltage is applied to the sample. Majority carriers are excited, thereby applying modulation to a capacitance of the system. The frequency of the high-frequency voltage applied to the sample is 100 kHz, and the voltage is 4.0 V.

Although it has been illustrated that the first conductivity type is the n type conductivity and the second conductivity type is the p type conductivity in the above description, the first conductivity type may be the p type conductivity and the second conductivity type may be the n type conductivity. The impurity concentration of the impurity region having the n type conductivity is the concentration of the n type impurity. The impurity concentration of the impurity region having the p type conductivity is the concentration of the p type impurity.

Next, functions and effects of silicon carbide semiconductor device 100 according to each of the embodiments will be described.

In the super junction structure, as the impurity concentration of each of first region 41 and second region 42 is higher and the pitch (the total of the width of first region 41 and the width of second region 42) is smaller, on-resistance can be reduced more. Further, as the thickness of each of first region 41 and second region 42 is larger, breakdown voltage is higher. Therefore, in order to reduce the on-resistance and attain high breakdown voltage, it is desirable that each of the thicknesses of first region 41 and second region 42 is large and the pitch (the total of the width of first region 41 and the width of second region 42) is small.

Normally, when impurity ions are implanted into the silicon carbide layer with high acceleration energy, scattering becomes large in the silicon carbide layer. Therefore, the width of the implantation region becomes larger than the opening width of the mask pattern. As a result, it is difficult to form a super junction structure having a large thickness and a small pitch. Further, the thickness of the mask pattern needs to be large in order to implant impurity ions deeply. However, as the thickness of the mask pattern is larger, stress becomes large, thus resulting in occurrence of a problem such as large warpage of a wafer.

On the other hand, an implantation depth that can be attained with a low acceleration energy of about 1 MeV or less is about 1 µm. For example, in order to obtain super junction layer 10 having a breakdown voltage of about 1.2 kV, it is necessary to repeat the epitaxial growth and the ion implantation about five or six times.

Super junction layer 10 of silicon carbide semiconductor device 100 according to the present embodiment is formed by using the channeling implantation technique. Therefore, super junction layer 10 having a large thickness and a small pitch can be formed with a low acceleration energy of about 1 MeV or less. Specifically, the total value of the width of first portion 71 and the width of third portion 73 is 0.5 µm or more and 4 µm or less, and the height of each of first region 41 and second region 42 is 2 µm or more. Thus, the breakdown voltage can be improved while reducing the on-resistance.

Further, according to silicon carbide semiconductor device 100 of the present embodiment, the number of times of performing each of the epitaxial growth and the ion implantation can be reduced. Therefore, a polycrystalline silicon carbide particle can be suppressed from being sandwiched between the epitaxial layers. This results in improved yield of silicon carbide semiconductor device 100.

Further, when the p type regions are formed by repeating the epitaxial growth and the ion implantation, a portion of a p type region formed in a lower epitaxial layer needs to be overlapped with a portion of a p type region formed in an upper epitaxial layer so as to connect the upper and lower p type regions to each other. The impurity concentration of each of the overlapping portions of the p type regions is higher than the impurity concentration of each of the non-overlapping portions of the p type regions. By reducing the number of times of performing each of the epitaxial growth and the ion implantation, the number of the overlapping portions of the p type regions can be reduced. Therefore, a charge balance in super junction layer 10 can be suppressed from being lost.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 5: trench; 6: gate insulating film; 8: side surface; 9: bottom portion; 10: super junction layer; 11: substrate; 12: buffer layer; 13: second drift layer; 14: first drift layer; 15: first impurity region; 20: fifth impurity region; 21: first connection region; 22: second connection region; 23: second impurity region; 24: fourth impurity region; 30: third impurity region; 40: element layer; 41: first region; 42: second region; 52: gate electrode; 6261: first electrode; 6162: second electrode; 63: third electrode; 64: separation insulating film; 71: first portion; 72: second portion; 73: third portion; 74: fourth portion; 100: silicon carbide semiconductor device; 101: first direction; 102: second direction; 103: third direction; P: pitch; T1: first height; T2: second height; T3: third height; W1: first width; W2: second width; W3: third width; W4: fourth width.

The invention claimed is:

1. A silicon carbide semiconductor device comprising:
a substrate composed of a silicon carbide semiconductor having a first conductivity type;
a super junction layer that is provided above a first main surface of the substrate and that alternately has a first region having the first conductivity type and a second region having a second conductivity type;
an element layer provided above the super junction layer, the element layer comprising a first impurity region having the first conductivity type;
a first electrode provided on the element layer; and
a second electrode provided on a second main surface of the substrate opposite to the first main surface, wherein
the element layer is provided with a trench that has a bottom portion constituted of the first impurity region,
a gate electrode is provided inside the trench,
a connection region having the second conductivity type is in contact with the second region and the first impurity region,
the first impurity region separates the gate electrode from the connection region, the first region has a first portion and a second portion located between the first portion and the first main surface,
the second region has a third portion in contact with the first portion and a fourth portion in contact with the second portion and located between the third portion and the first main surface, and
in a cross section perpendicular to the second main surface and parallel to a direction from the first region toward the second region, a width of the second portion is larger than a width of the first portion and is monotonously increased in a direction from the first portion toward the first main surface, a width of the fourth portion is smaller than a width of the third portion and is monotonously decreased in a direction from the third portion toward the first main surface, a total value of the width of the first portion and the width of the third portion is 0.5 μm or more and 4 μm or less, and a height of each of the first region and the second region is 2 μm or more.

2. The silicon carbide semiconductor device according to claim 1, wherein in the cross section perpendicular to the second main surface and parallel to the direction from the first region toward the second region, the width of the first portion is smaller than a height of the first portion, and the width of the third portion is smaller than a height of the third portion.

3. The silicon carbide semiconductor device according to claim 1, wherein an impurity concentration in the third portion is higher than an impurity concentration in the fourth portion.

4. The silicon carbide semiconductor device according to claim 1, wherein an impurity concentration of each of the first portion and the third portion is $3\times10^{16}$ cm$^{-3}$ or more and $5\times10^{17}$ cm$^{-3}$ or less.

5. The silicon carbide semiconductor device according to claim 1, wherein a buffer layer having the first conductivity type is provided between the super junction layer and the substrate.

6. The silicon carbide semiconductor device according to claim 1, wherein the element layer further includes a second impurity region in contact with the first impurity region and having the second conductivity type, and a third impurity region separated from the first impurity region by the second impurity region and having the first conductivity type, the trench further has a side surface constituted of each of the first impurity region, the second impurity region, and the third impurity region, the bottom portion of the trench is contiguous to the side surface, and the second electrode is a source electrode, and the first electrode is a drain electrode.

7. The silicon carbide semiconductor device according to claim 1, wherein the first main surface corresponds to a {0001} plane or a plane inclined at an angle of 8° or less with respect to the {0001} plane.

8. A silicon carbide semiconductor device, comprising:

a substrate composed of a silicon carbide semiconductor having a first conductivity type;

a super junction layer that is provided above a first main surface of the substrate and that alternately has a plurality of first regions having the first conductivity type and a plurality of second regions having a second conductivity type, the first regions being stacked together, the second regions being stacked together;

an element layer provided above the super junction layer;

a first electrode provided on the element layer; and a second electrode provided on a second main surface of the substrate opposite to the first main surface, wherein wherein each of the first regions has a first portion and a second portion located between the first portion and the first main surface, wherein each of the second regions has a third portion and a fourth portion, the third portion being in contact with the first portion, and the fourth portion being in contact with the second portion and located between the third portion and the first main surface, and wherein, in a cross section perpendicular to the second main surface and parallel to a direction from the first regions toward the second regions, a width of the second portion is larger than a width of the first portion and is monotonously increased in a direction from the first portion toward the first main surface, a width of the fourth portion is smaller than a width of the third portion and is monotonously decreased in a direction from the third portion toward the first main surface, a total value of the width of the first portion and the width of the third portion is 0.5 μm or more and 4 μm or less, and a height of each of the first regions and each of the second regions is 2 μm or more.

9. The silicon carbide semiconductor device according to claim 8, wherein the element layer comprises a first impurity region having the first conductivity layer, wherein the element layer is provided with a trench that has a bottom portion constituted of the first impurity region, wherein a gate electrode is provided inside the trench, wherein a connection region having the second conductivity type is in contact with the multiple second regions and the first impurity region, and wherein the first impurity region separates the gate electrode from the connection region.

10. The silicon carbide semiconductor device according to claim 1, wherein the connection region is in contact with the third portion of the second region.

11. The silicon carbide semiconductor device according to claim 9, wherein the connection region is in contact with one of the third portions of the multiple second regions.

* * * * *